(12) United States Patent
Poddar et al.

(10) Patent No.: US 8,101,470 B2
(45) Date of Patent: Jan. 24, 2012

(54) FOIL BASED SEMICONDUCTOR PACKAGE

(75) Inventors: Anindya Poddar, Sunnyvale, CA (US);
Nghia Thuc Tu, San Jose, CA (US);
Jaime Bayan, San Francisco, CA (US);
Will Wong, Belmont, CA (US); David Chin, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 125 days.

(21) Appl. No.: 12/571,202

(22) Filed: Sep. 30, 2009

(65) Prior Publication Data

US 2011/0074003 A1   Mar. 31, 2011

(51) Int. Cl.
*H01L 23/28* (2006.01)
*H01L 21/56* (2006.01)

(52) U.S. Cl. ............. 438/124; 438/110; 438/113

(58) Field of Classification Search ......... 438/110, 438/113, 134
See application file for complete search history.

(56) References Cited

U.S. PATENT DOCUMENTS

| | | | |
|---|---|---|---|
| 4,048,438 A | 9/1977 | Zimmerman | |
| 5,308,797 A | 5/1994 | Kee | |
| 5,942,314 A | 8/1999 | Fisher et al. | |
| 5,976,912 A * | 11/1999 | Fukutomi et al. | 438/110 |
| 6,268,648 B1 | 7/2001 | Fukutomi et al. | |
| 6,518,161 B1 | 2/2003 | Rajagopalan et al. | |
| 6,534,849 B1 | 3/2003 | Gang | |
| 6,769,174 B2 | 8/2004 | Siegel et al. | |
| 2002/0039808 A1* | 4/2002 | Fukutomi et al. | 438/106 |
| 2004/0127011 A1 | 7/2004 | Huang et al. | |
| 2006/0060981 A1 | 3/2006 | Paulus | |
| 2007/0176303 A1 | 8/2007 | Murai et al. | |
| 2009/0305076 A1 | 12/2009 | Wong et al. | |
| 2010/0046188 A1 | 2/2010 | Bayan et al. | |
| 2010/0084748 A1 | 4/2010 | Poddar et al. | |

FOREIGN PATENT DOCUMENTS

| | | |
|---|---|---|
| JP | 09-252014 A | 9/1997 |
| JP | 11-195733 | 7/1999 |
| JP | 2000-252389 | 9/2000 |
| JP | 2001-127212 | 5/2001 |

(Continued)

OTHER PUBLICATIONS

Notice of Allowance dated Oct. 12, 2010 from U.S. Appl. No. 12/195,704.*

(Continued)

*Primary Examiner* — N Drew Richards
*Assistant Examiner* — Robert Carpenter
(74) *Attorney, Agent, or Firm* — Beyer Law Group LLP

(57) ABSTRACT

The present inventions relate to methods and arrangements for using a thin foil to form electrical interconnects in an integrated circuit package. One embodiment of the present invention involves attaching multiple dice to a foil carrier structure. The foil carrier structure is made of a thin foil that is bonded to a carrier. The dice and at least a portion of the metallic foil is then encapsulated with a molding material. The carrier is removed, leaving behind a molded foil structure. The exposed foil is patterned and etched using photolithographic techniques to define multiple device areas in the foil. Each device area includes multiple conductive lines. Afterwards, portions of the conductive lines are covered with a dielectric material and other portions are left exposed to define multiple bond pads in the device area. The molded foil structure can be singulated to form multiple integrated circuit packages.

19 Claims, 6 Drawing Sheets

FOREIGN PATENT DOCUMENTS

JP    2004-058578 A    2/2004

OTHER PUBLICATIONS

FlipChip International, "Bump on I/O Process," downloaded on Nov. 1, 2007 from http://www.flipchip.com/services/wafer_level/ultra_csp/bump_process.shtml.

FlipChip International, "Redistributed Process," downloaded on Nov. 1, 2007 from http://www.flipchip.com/services/wafer_level_ultra_csp/redistributed_process.shtml.

U.S. Appl. No. 12/571,223, filed Sep. 30, 2009.

Search Report dated Jan. 13, 2010 from International Application No. PCT/US2009/046000.

Written Opinion dated Jan. 13, 2010 in from International Application No. PCT/US2009/046000.

International Search Report dated Dec. 23, 2009 from International Application No. PCT/US2009/043503.

Written Opinion dated Dec. 23, 2009 from International Application No. PCT/US2009/043503.

Search Report dated Jun. 16, 2011 from International Application No. PCT/US2010/053453.

Written Opinion dated Jun. 16, 2011 from International Application No. PCT/US2010/053453.

Office Action dated Jul. 29, 2011 from U.S. Appl. No. 12/133,335.

* cited by examiner

FOIL BASED SEMICONDUCTOR PACKAGE

CROSS REFERENCE TO RELATED APPLICATIONS

This application is related to U.S. patent application Ser. No. 12/133,335, entitled "Foil Based Semiconductor Package," filed Jun. 4, 2008, and U.S. patent application Ser. No. 12/195,704, entitled "Thin Foil Semiconductor Package," filed Aug. 21, 2008, which are hereby incorporated by reference in their entirety for all purposes.

FIELD OF THE INVENTION

The present invention relates generally to the packaging of integrated circuits (ICs). More particularly, the invention relates to packaging methods and arrangements involving thin foils.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connections to external devices.

Many conventional leadframes have a thickness of approximately 4-8 mils. Further reducing the thickness of the leadframe offers several benefits, including the potential of reducing the overall package size and conserving leadframe metal. In general, however, a thinner leadframe has a greater propensity to warp during the packaging process. A supporting structure, such as backing tape, may be applied to the leadframe to reduce the risk of warpage. Such structures, however, may entail higher costs.

At various times, package designs have been proposed that utilize a metal foil as the electrical interconnect structure in place of the leadframe. Although a number of foil based designs have been developed, none have achieved widespread acceptance in the industry in part because foil based packaging processes tend to be more expensive than conventional leadframe packaging and in part because much of the existing packaging equipment is not well suited for use with such foil based package designs.

Although existing techniques for fabricating leadframes and for packaging integrated circuits using leadframe technology work well, there are continuing efforts to develop even more efficient designs and methods for packaging integrated circuits.

SUMMARY OF THE INVENTION

The claimed inventions relate to methods and arrangements for using a thin foil to form electrical interconnects in an integrated circuit package. One embodiment of the present invention involves attaching multiple dice to a foil carrier structure. The foil carrier structure is made of a thin foil that is bonded to a carrier. The dice and at least a portion of the metallic foil are then encapsulated with a molding material. The carrier is removed, leaving behind a molded foil structure. The exposed foil is patterned using known photolithographic techniques, then etched to define multiple device areas in the foil. Each device area includes multiple conductive lines. Afterwards, portions of the conductive lines are covered with a dielectric material and other portions are left exposed to define multiple bond pads in the device area. The molded foil structure is singulated to form multiple integrated circuit packages.

The foil carrier structure can be arranged so that it can be easily processed using existing packaging equipment. Various implementations involve a metallic foil having a thickness between 8 and 35 microns and a carrier having a thickness between 7 and 20 mils. In some embodiments, the foil can be attached to the carrier using ultrasonic bonding. Properly applied, ultrasonic bonding can form a bond that can both tolerate the stresses of the packaging process and not unduly hinder the later removal of the carrier from the foil.

Another embodiment of the present invention relates to a molded foil carrier structure that is useful in forming thin foil integrated circuit packages. Multiple integrated circuit dice are supported by multiple device areas. Each device area is formed from a thin foil and includes a plurality of conductive lines. Each conductive line includes a conductive trace, a land and a solder pad. The land, which is situated on a top surface of the conductive line, is coupled with an I/O pad of an associated die. The solder pad is on an opposing bottom surface of the conductive line. The conductive trace electrically and physically connects the solder pad and the land. A dielectric layer covers the traces and the lands. The solder pads are exposed through openings in the dielectric layer to define multiple bond pads on the exterior of the molded foil structure. A molding material encapsulates the dice and helps hold together the dice and the device areas.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. More particularly, the invention relates to improved, low-cost methods and arrangements for using a thin foil to form electrical interconnects in an integrated circuit package.

Thin foils present semiconductor manufacturers with several challenges. As noted earlier, thin foil has a greater tendency to warp under the stresses of the packaging process. Additionally, existing packaging equipment, which is configured for handling leadframes, is typically ill suited for processing thin foils, since thin foils differ in size and are more fragile than conventional leadframes. Various embodiments of the present invention, which are described below, address these challenges.

Figure 1:
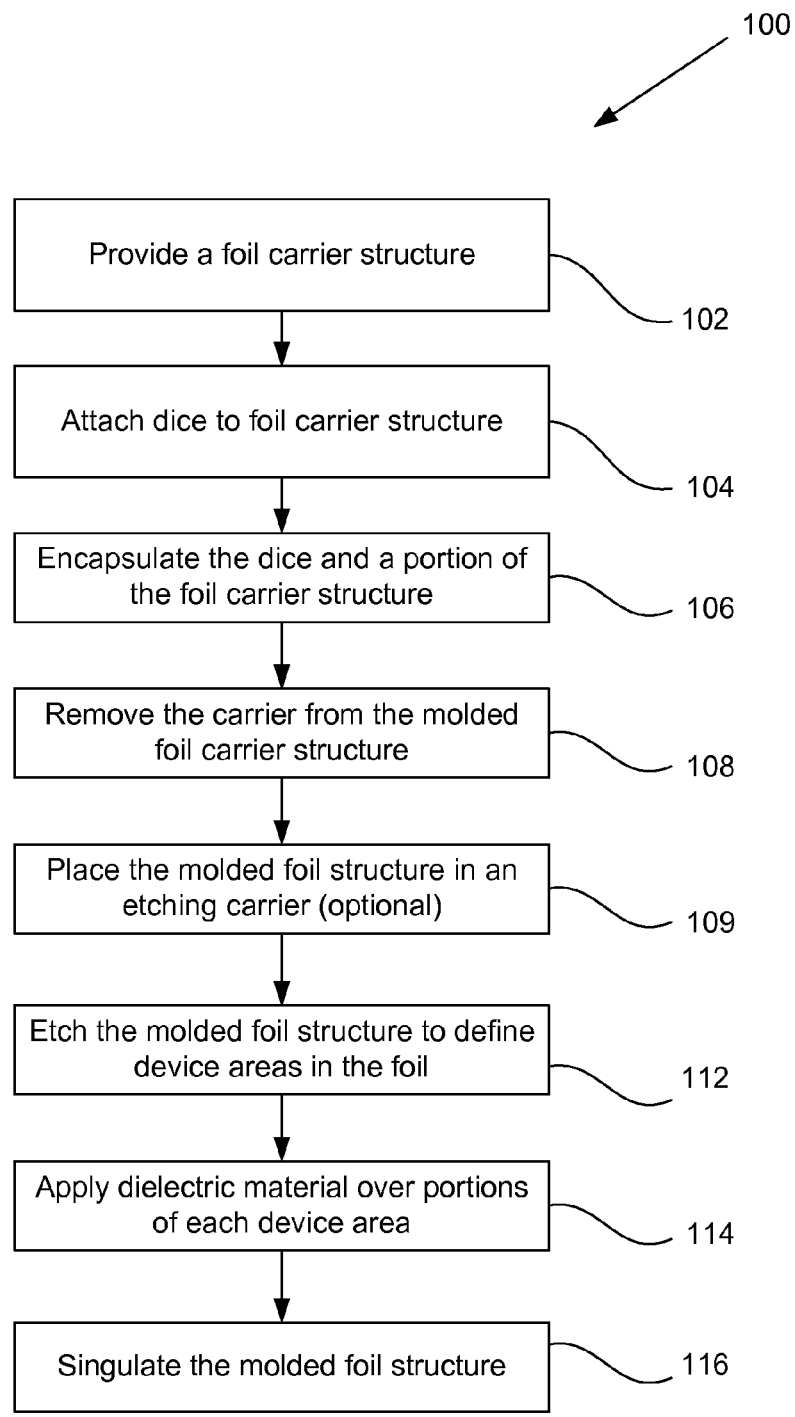
FIG. 1 is a flow chart illustrating a process for packaging an integrated circuit device in accordance with one embodiment of the present invention.

One embodiment of the present invention, which is described in FIG. 1, involves a method 100 for more efficiently integrating thin foils into a semiconductor packaging process. The method 100 involves attaching one or more integrated circuit dice to a thin foil that is bonded to a carrier. Afterward, the dice and portions of the foil are encapsulated and the carrier is removed. The exposed foil on the resulting molded foil structure is then patterned using a photoresist mask and etched to define multiple device areas that each support one or more of the dice. Each device area includes multiple conductive lines. Each conductive line can include a solder pad, a land and a connecting conductive trace. A dielectric layer is selectively applied to cover the traces and lands of each device area while leaving the solder pads exposed. The molded foil structure can then be solder bumped and singulated to form individual integrated circuit packages. Some advantages of the method 100 include its compatibility with existing packaging equipment and its deferral of the etching of the foil until the later stages of the packaging process.

The operations of the method 100 of FIG. 1 are described in greater detail below and illustrated in FIGS. 2-4. Initially, in step 102, a foil carrier structure 200 of FIG. 2A, which includes a foil 206 bonded to a carrier 208, is provided. Projected saw streets 202 indicate where the foil carrier structure 200 will be later cut to form multiple integrated circuit packages. In some embodiments, the foil 206 is made of copper and the carrier 208 is made of aluminum, although the foil 206 and the carrier 208 can be made of other suitable materials as well. For example, the foil 206 can include multiple layers and/or metals, such as copper, nickel and palladium. Various implementations use a foil 206 having a thickness between 8 and 35 microns and/or a carrier having a thickness between 7 and 20 mils.

In some embodiments, the foil 206 may be ultrasonically bonded with the carrier 208. Ultrasonic bonding offers the benefit of being strong enough to endure stresses imposed by later stages of the packaging process while still allowing the carrier to be easily separated from the foil after dice and molding material have been added to the foil. The term ultrasonic bonding, as used herein, includes any suitable bonding technique having an ultrasonic component, including thermosonic bonding. Although ultrasonic bonding works well, it should be appreciated that other suitable bonding techniques may be used to secure the foil to the carrier. By way of example, a variety of suitable adhesives may be used. Various techniques for welding the foil to the carrier and forming the foil carrier structure 200 are discussed in U.S. patent application Ser. No. 12/133,335 published as U.S. Published Patent Application No. 2009/0305076 A1 entitled "Foil Based Semiconductor Package," filed Jun. 4, 2008, which is hereby incorporated by reference in its entirety for all purposes.

Figure 2A:
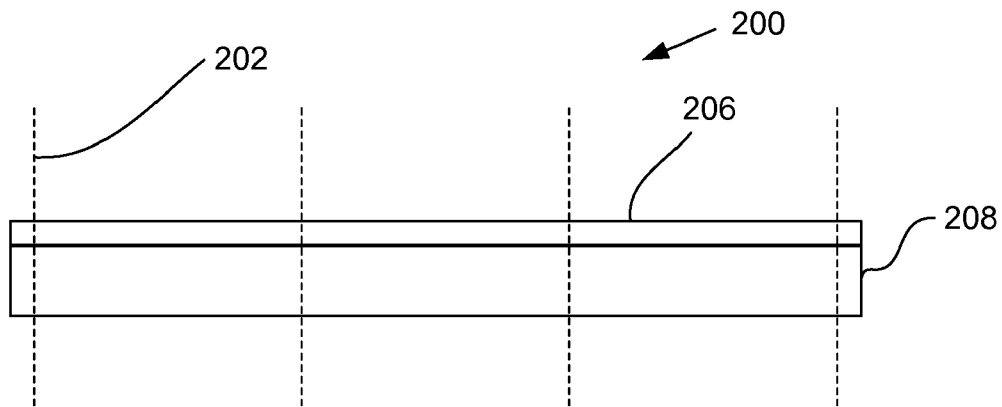
FIGS. 2A-2E are diagrammatic side views of various stages of the packaging process in accordance with one embodiment of the present invention.
Figure 2B:
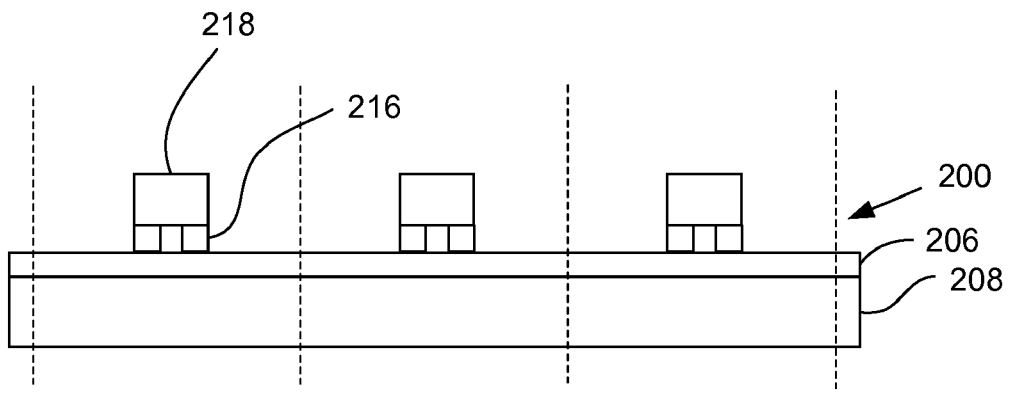

In step 104, dice 218 of FIG. 2B are attached to the foil carrier structure 200 using conventional die attach techniques. In the illustrated embodiment, the dice 218 are attached to the foil 206 in a flip chip arrangement. I/O pads on the active faces of the dice 218 are electrically connected to the foil 206 using solder bumps 216. Some or all of the dice 218 could instead be electrically coupled with the foil 206 using wire bonding. Although FIG. 2B shows the foil carrier structure supporting only several dice 218, it should be appreciated that the foil carrier structure 200 can be sized and arranged to support hundreds of dice or more.

Figure 2C:
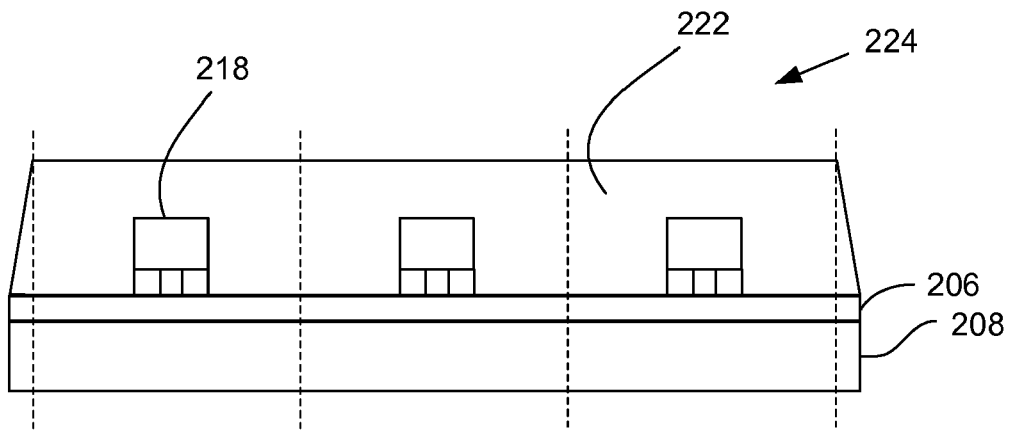

In step 106 and FIG. 2C, dice 218 and at least a portion of the top surface of the foil 206 are encapsulated with a molding material 222, forming molded foil carrier structure 224. In the illustrated embodiment of FIG. 2C, molding material 222 is added in a single continuous strip. That is, the molding material has been relatively evenly applied across the molded portions of foil 206. It is noted that this type of molding is not common in leadframe based packaging. Rather, the devices carried on leadframe strips are typically molded either individually or in sub-panels. The benefits of a continuous strip of molding material will be discussed in connection with FIGS. 2D, 2E and step 108.

Figure 2D:
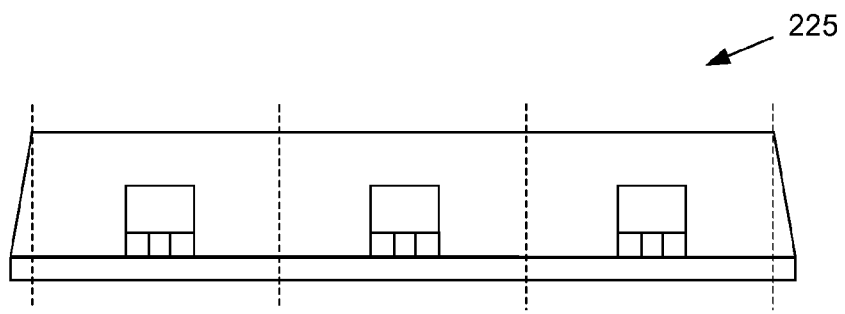

In step 108, the carrier portion of molded foil carrier structure 224 of FIG. 2C is removed, resulting in molded foil structure 225 of FIG. 2D. At this point the molding material 222 provides structural support for the foil in place of the carrier 208. It should be appreciated that an advantage of the continuous strip molding approach is that it provides good support for the entire panel so that the strip may still be handled in panel form. In contrast, if molding gaps are provided between subpanels during the molding operation, then the subpanels would need to be handled independently after removal of the carrier.

Figure 2E:
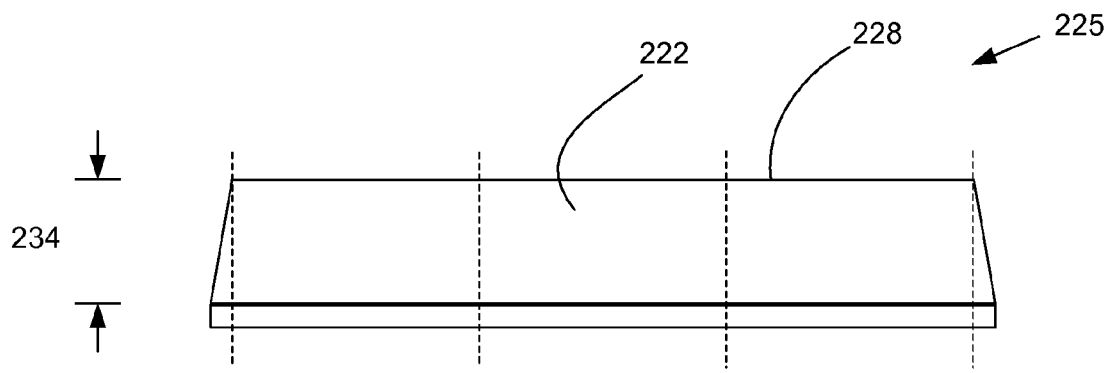

FIG. 2E presents an external view of molded foil structure 225. It should be appreciated that although the top surface 228 of molded foil structure 225 is substantially planar, this is not a requirement. Molding material 222 in molded foil structure 225 may assume a variety of patterns and shapes, and the depth 234 of molding material 222 may vary along the length of molded foil structure 225.

Referring to step 109 of FIG. 1, the exposed foil 206 of the molded foil structure 225 of FIG. 2E is then patterned using known photolithographic techniques. In various embodiments, a photoresist layer is applied over the foil 206. Portions of the photoresist layer are selectively exposed to light. A developer solution is then applied to remove portions of the photoresist layer to form a desired pattern. A wide variety of approaches known to persons of ordinary skill in the art can be used to pattern the exposed foil 206.

Figure 3A:
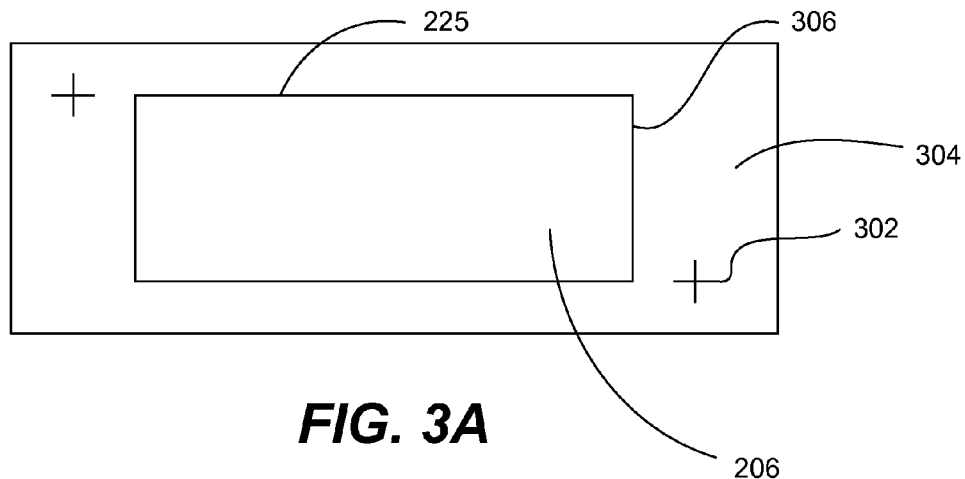
FIG. 3A is a diagrammatic top view of an etching carrier after the molded foil structure illustrated in FIG. 2E has been placed in the carrier in accordance with one embodiment of the present invention.
Figure 3B:
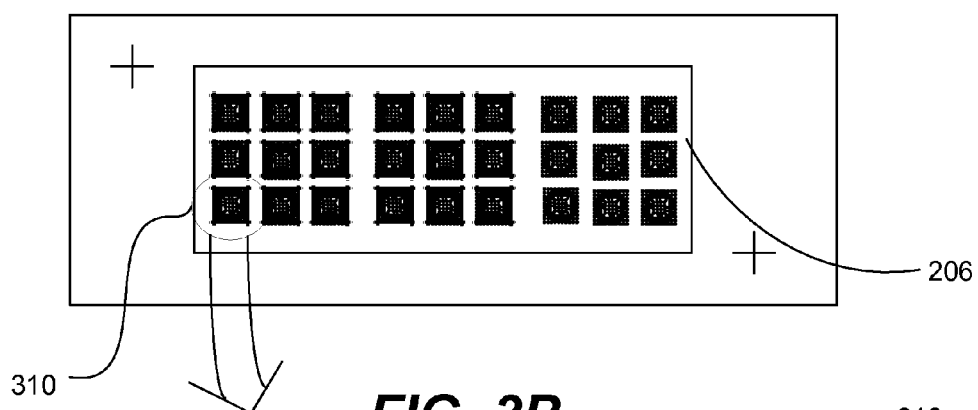
FIG. 3B is a diagrammatic top view of the etching carrier and the molded foil structure illustrated in FIG. 3A after the foil has been etched in accordance with one embodiment of the present invention.

In step 111, molded foil structure 225 is placed in etching carrier 304 as illustrated in FIGS. 3A and 3B. FIG. 3A illustrates a top view of etching carrier 304 containing molded foil structure 225. In the illustrated embodiment, etching carrier 304 includes alignment holes 302 and a cavity 306 configured to receive molded foil structure 225. Etching carrier 304 is designed to receive molded foil structure 225 of FIG. 2E such that the top surface 228 of the molded foil structure is hidden within cavity 306 and foil 206 is exposed. The etching carrier may be reusable and can be made of various materials, including aluminum and fiber glass.

Figure 4A:
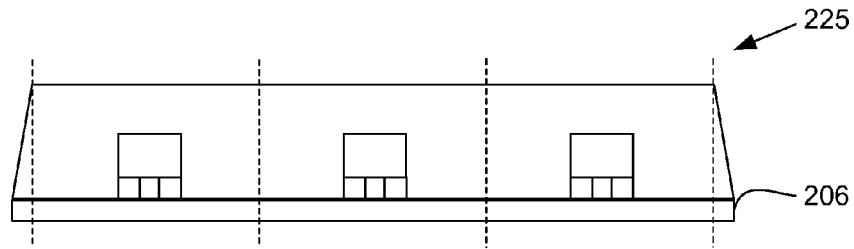
FIGS. 4A-4B are diagrammatic side views of the molded foil structure illustrated in FIG. 2E before and after the etching of the foil in accordance with one embodiment of the present invention.
Figure 4B:
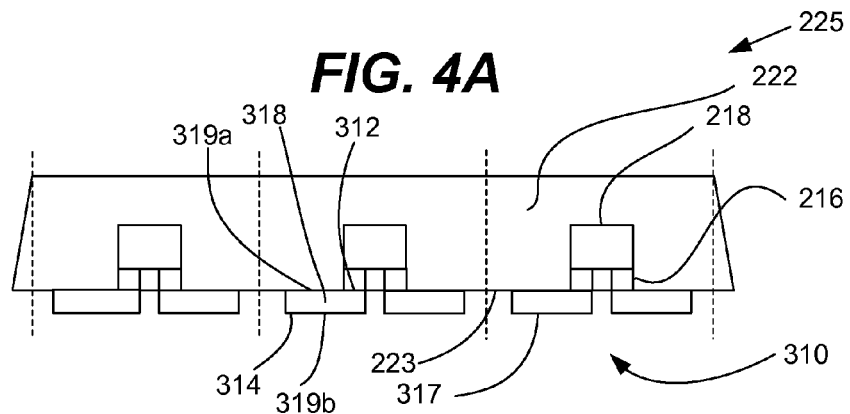

In step 112, foil 206 is etched using any suitable technique known to persons of ordinary skill in the art, such as chemical etching. As shown in FIGS. 3B, 4A and 4B, the etching removes portions of foil 206 and defines multiple device areas 310. Each device area 310 is arranged to support one or more of the dice 218.

As shown in FIG. 4B, the device area 310 can include multiple conductive lines 317 that extend laterally across the bottom surface 223 of the molding material 222. The conductive lines 317 redistribute I/O pads of the die 218 to various solder pads outside and/or within the periphery of the die 218.

Each conductive line 317 can include a land region 312, a solder pad region 314 and a conductive trace region 318 that extends between and electrically connects the land 312 and the solder pad 314. Each land 312 and solder pad 314 is situated on the top surface 319a and the bottom surface 319b, respectively, of their corresponding conductive line 317. In the illustrated embodiment, the die 218 is mounted in a flip chip arrangement onto lands 312 using solder joints 216. Die 218 can also be electrically coupled with lands 312 using any known technique, such as wire bonding.

Figure 3C:
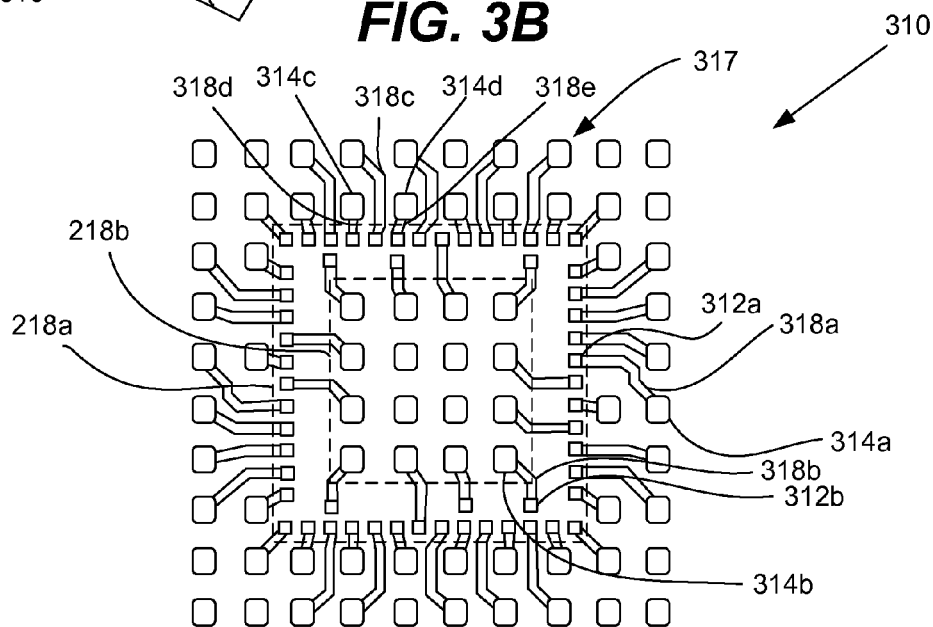
FIG. 3C is an enlarged diagrammatic top view of a device area of FIG. 3B in accordance with one embodiment of the present invention.

A diagrammatic top view of the device area 310 is illustrated in FIG. 3C. Conductive lines 317, which each include a land 312, a solder pad 314 and a connecting conductive trace 318, fan out towards the periphery of the device area 310. Solder pads 314 and corresponding lands 312 are laterally offset from one another and can be arranged almost anywhere within the device area 310. Each land 312 can be electrically coupled with an I/O pad of the integrated circuit die 218 and can be situated outside or within the profile of the integrated circuit die 218. For example, in an embodiment where at least some of the lands 312 are situated outside the periphery of the die 218b, die 218b can be electrically connected to such lands 312 via bonding wires. In another embodiment that instead involves die 218a, die 218a overlaps lands 312 and electrically connects with the lands 312 via solder bumps. Still other embodiments can involve a mix of wire bonding and solder bumping.

Generally, the lands 312, solder pads 314 and traces 318 can be arranged in various ways to help optimize the use of real estate on the active face of the die 218 and increase the number of external electrical connections thereto. Some lands 312 can be redistributed outward towards the periphery of the device area 310. An example of such routing is land 312a, which is redistributed outward via trace 318a to a solder pad surface 314a and positioned closer to the center of the device area 310 than the solder pad surface 314a. Lands 312 can also be redistributed inwards towards the center of device area 310, as shown by land 312b, which is redistributed inward via trace 318b to a solder pad 314b and positioned further from the center of the device area 310 than the solder pad 314b.

The conductive lines 317 and their corresponding conductive traces 318 and solder pads 314 can have various lengths and shapes. For example, conductive trace 318c is substantially longer than the adjacent conductive traces 318d and 318e and extends between and beyond corresponding solder pads 314c and 314d. The width of the solder pads 314 can be the same or substantially greater than the width of their corresponding conductive traces 318. A solder pad can have a circular profile and/or lack sharp edges, which may help reduce the risk of delamination.

The solder pads 314 can be arranged in multiple rows and/or in a grid array that is fully or not fully populated. In the illustrated embodiment, a 4×4 grid of solder pads is positioned at the center of device area 310. Multiple rows of additional solder pads run parallel to each side of the grid. Solder pads 314 and corresponding lands 312 can be arranged in almost any manner to address the needs of various applications.

Figure 4C:
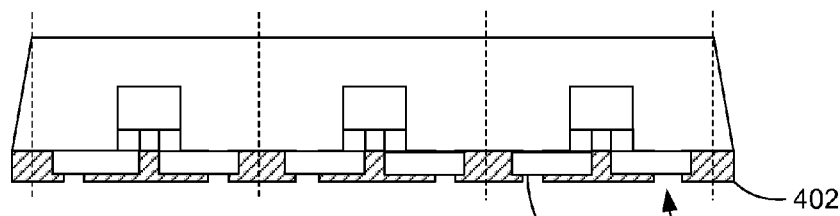
FIG. 4C is a diagrammatic side view of the molded foil structure illustrated in FIG. 4B after dielectric material has been selectively applied in accordance with one embodiment of the present invention.
Figure 4D:
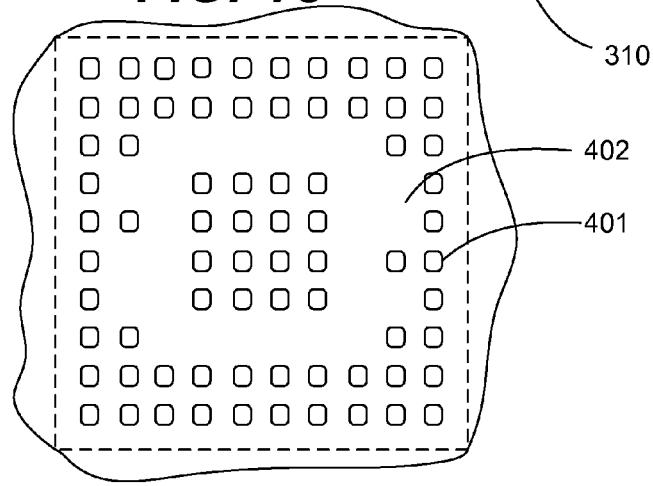
FIG. 4D is a diagrammatic bottom view of a portion of the molded foil structure of FIG. 4C in accordance with one embodiment of the present invention.

Afterwards, in step 114 of FIG. 1 a dielectric material 402 is selectively applied over portions of each device area 310, as illustrated in FIG. 4C. The dielectric material can be, for example, a photo-imageable solder mask that is patterned using known photolithographic techniques. As illustrated in FIG. 4D, the dielectric material 402 is applied to cover the lands 312 and traces 318 of FIG. 3C while leaving the solder pads 314 exposed. The exposed solder pads 314 define bond pads 401 on the bottom of the molded foil structure 225.

Figure 4E:
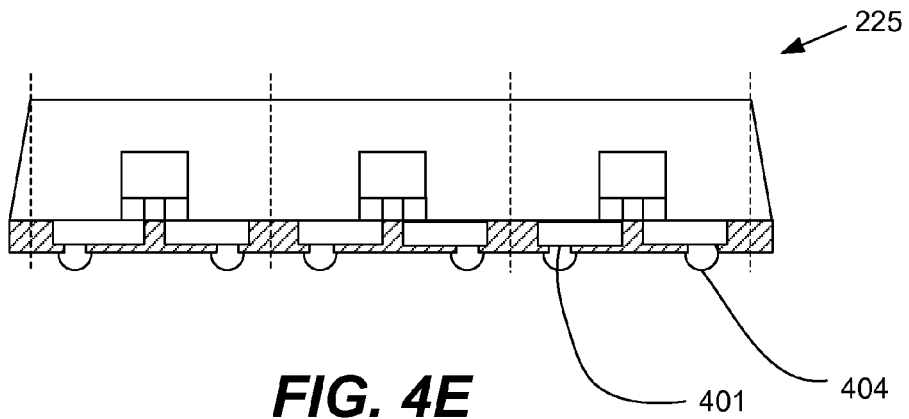
FIG. 4E is a diagrammatic side view of the molded foil structure of FIG. 4C after solder bumping in accordance with one embodiment of the present invention.
Figure 4F:
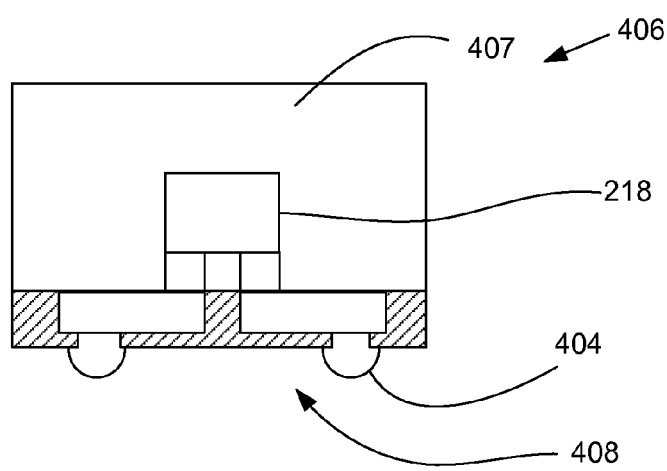
FIG. 4F is a diagrammatic side view of an individual integrated circuit package in accordance with one embodiment of the present invention.
Figure 4G:
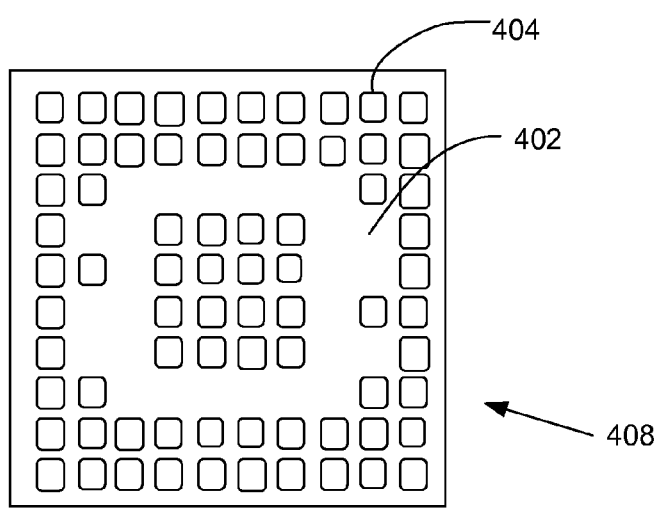
FIG. 4G is a diagrammatic bottom view of the integrated circuit package of FIG. 4F in accordance with one embodiment of the present invention.

As illustrated in FIG. 4E, solder bumps 404 can be formed onto bond pads 401. In step 116, the molded foil structure 225 is singulated to form multiple integrated circuit packages. An exemplary integrated circuit package 406 is shown in FIG. 4F. A diagrammatic top down view of the bottom surface 408 of the integrated circuit package 406 is shown in FIG. 4G. The bottom surface 408 supports multiple solder bumps 404 that are electrically isolated from one another by dielectric material 402 and provide external electrical access to the encapsulated integrated circuit die 218 of FIG. 4F.

Although only a few embodiments of the invention have been described in detail, it should be appreciated that the invention may be implemented in many other forms without departing from the spirit or scope of the invention. For example, FIG. 3C illustrates a particular device area 310, but various device area arrangements that depart from FIG. 3C are also possible. Conductive lines 317 can extend in almost any direction and can assume a wide variety of shapes and sizes. Device 310, as illustrated, depicts a grid array of solder pads that is not fully populated, but in some embodiments the grid array is fully or almost fully populated. In the illustrated embodiment, lands 312 are generally positioned along the periphery of device area 310, but they can also be positioned at the center of the device area 310, in a grid or grid-like formation, or in any other suitable arrangement. In some embodiments, the lands 312 can be redistributed out in a fan-out arrangement. At least some of the lands 312 can also be redistributed inward toward the center of device area 310 in a fan-in arrangement. FIG. 3C depicts solder pads 314 as taking up much of the real estate directly underneath the die 218b. In some implementations, lands 312, instead of solder pads 314, take up much or all of that real estate, are arranged in a like manner and/or are coupled with the die 312b with solder joints in a flip chip style arrangement. It should also appreciated that although various operations are suggested, some of these operations can be modified, reordered and/or eliminated as appropriate to address the needs of particular applications. For example, step 111 of FIG. 1 refers to placing the molded foil structure in an etching carrier. Such a step, however, is optional, and the etching process can take place without the use of an etching carrier. The exposed foil 206 of the molded foil structure 225 of FIG. 2E can be selectively etched using any approach known in the art, including approaches that differ from those described in connection with FIG. 1. Therefore, the present embodiments should be considered as illustrative and not restrictive and the invention is not limited to the details given herein, but may be modified within the scope and equivalents of the appended claims.

What is claimed is:

1. A method for packaging integrated circuit devices, comprising:
   providing a foil carrier structure including a metallic foil adhered to a carrier, the metallic foil being a continuous sheet of metal wherein only some portions of a bottom surface of the foil are bonded to the carrier and wherein other portions of the bottom surface of the foil are not bonded to the carrier;
   attaching a multiplicity of dice to the metallic foil;
   encapsulating the multiplicity of dice and at least a portion of the metallic foil with a molding material to form a molded foil carrier structure wherein the metallic foil remains a continuous sheet of metal during the encapsulation operation;
   after encapsulating the multiplicity of dice, removing the carrier from the molded foil carrier structure to form a molded foil structure;
   after removing the carrier, patterning the metallic foil using photolithographic techniques then etching the metallic foil to expose portions of the underlying molding material and form a multiplicity of device areas, each device area supporting an associated die and including a plurality of conductive lines; and
   after etching the metallic foil, selectively covering portions of the conductive lines of each device area and leaving other portions of the conductive lines exposed to define a plurality of bond pads in the device area.

2. The method of claim 1 wherein each conductive line of each device area includes a first surface, an opposing second surface, a conductive trace, a land and a solder pad, the conductive trace extending between and connecting the land to the solder pad, the land being on the first surface of the conductive line and being electrically coupled with an I/O pad of the associated die, the solder pad being on the second surface of the conductive line.

3. The method of claim 2 wherein the selective covering of portions of the conductive lines of each device area includes covering portions of the second surface of each conductive line such that the conductive trace of the conductive line is covered with a dielectric material and the solder pad of the conductive line is exposed through an opening in the dielectric material to define one of the plurality of bond pads in the device area.

4. The method of claim 3 wherein the dielectric material is a photo-imageable solder mask and wherein the selective covering of portions of the multiplicity of conductive lines of each device area includes:
   after the etching of the metallic foil, applying the dielectric material over the land, conductive trace and solder pad of each conductive line;
   photolithographically patterning the dielectric material; and
   removing portions of the dielectric material to expose the solder pad of each conductive line while leaving the land and conductive trace of the conductive line substantially unexposed.

5. The method of claim 2 wherein the width of the solder pad of each conductive line is substantially greater than the width of the conductive trace of the conductive line.

6. The method of claim 2 wherein the plurality of conductive lines of each device area includes a first, a second and a third conductive line, the conductive trace of the first conductive line positioned between the solder pads of the second and third conductive lines.

7. The method of claim 2, wherein:
   the attaching of the multiplicity of dice includes wire bonding at least one of the multiplicity of dice to the foil; and
   at least some of the lands of the plurality of conductive lines of each device area are electrically coupled with I/O pads of the associated die via bonding wires.

8. The method of claim 1 wherein the thickness of the metallic foil is approximately between 8 and 35 microns and the thickness of the carrier is approximately between 7 and 20 mils.

9. The method of claim 1 wherein the metallic foil is made of copper, the carrier is made of aluminum, the dielectric material is made of solder mask and portions of the metallic foil are ultrasonically bonded to the carrier.

10. The method of claim 1 further comprising:
    depositing solder to form solder bumps on the plurality of bond pads of each device area; and
    singulating the molded foil structure to form a multiplicity of integrated circuit packages.

11. The method of claim 1 wherein the encapsulating step includes applying the molding material such that a single, continuous molded strip is formed on the metallic foil that encapsulates and helps to hold together the multiplicity of dice.

12. The method of claim 1, further comprising placing the molded foil structure in a cavity of a reusable etching carrier configured to expose the metallic foil to an etching process.

13. The method of claim 2 wherein the solder pads of the plurality of conductive lines of each device area form a first plurality of rows of solder pads, each row of the first plurality of rows including at least two solder pads, the rows being arranged parallel to one another.

14. The method of claim 13 wherein the first plurality of rows of solder pads in each device area includes a grid of solder pads at the center of the device area, the grid of solder pads including at least four solder pads and being substantially surrounded by a second plurality of rows of solder pads, the second plurality of rows of solder pads being arranged such that at least one row of the second plurality of rows of solder pads extends parallel to each side of the grid.

15. The method of claim 3 wherein the plurality of conductive lines of each device area is made of copper and the dielectric material is made of photo-imageable solder mask.

16. The method of claim 1 wherein the portions of the bottom surface of the foil that are bonded to the carrier are bonded using one selected from the group consisting of adhesive and ultrasonic bonding.

17. The method of claim 1 wherein the removing of the carrier involves separating the carrier as a whole from the foil.

18. The method of claim 17 wherein the removing of the carrier does not involve etching the carrier.

19. A method for packaging integrated circuit devices, comprising:
    providing a foil carrier structure including a metallic foil adhered to a carrier;
    attaching a multiplicity of dice to the metallic foil;
    encapsulating the multiplicity of dice and at least a portion of the metallic foil with a molding material to form a molded foil carrier structure;
    after encapsulating the multiplicity of dice, removing the carrier from the molded foil carrier structure to form a molded foil structure;
    after removing the carrier, patterning the metallic foil using photolithographic techniques then etching the metallic foil to expose portions of the underlying molding material and form a multiplicity of device areas, each device area supporting an associated die and including a plurality of conductive lines; and after etching the metallic foil, selectively covering portions of the conductive lines of each device area and leaving other portions of the conductive lines exposed to define a plurality of bond pads in the device area wherein each conductive line of each device area includes a first surface, an opposing second surface, a conductive trace, a land and a solder pad, the conductive trace extending between and connecting the land to the solder pad, the land being on the first surface of the conductive line and being electrically coupled with an I/O pad of the associated die, the solder pad being on the second surface of the conductive line, the conductive trace being exposed on the first and second surfaces of the conductive line and wherein the plurality of conductive lines of each device area includes a first and a second conductive line, the land of the first conductive line being positioned further from the center of the device area than the solder pad of the first conductive line, the land of the second conductive line being positioned closer to the center of the device area than the solder pad of the second conductive line.

* * * * *